(12) United States Patent
Ding

(10) Patent No.: US 9,874,610 B2
(45) Date of Patent: Jan. 23, 2018

(54) BATTERY

(71) Applicant: Huawei Technologies Co., Ltd., Shenzhen, Guangdong (CN)

(72) Inventor: Jie Ding, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 245 days.

(21) Appl. No.: 14/310,682

(22) Filed: Jun. 20, 2014

(65) Prior Publication Data

US 2014/0312911 A1  Oct. 23, 2014

Related U.S. Application Data

(63) Continuation of application No. PCT/CN2012/080785, filed on Aug. 30, 2012.

(30) Foreign Application Priority Data

Dec. 20, 2011  (CN) .......................... 2011 1 0428887

(51) Int. Cl.
| | |
|---|---|
| *G01R 31/36* | (2006.01) |
| *H01M 10/48* | (2006.01) |
| *H01M 10/42* | (2006.01) |
| *H01M 10/052* | (2010.01) |
| *H01M 2/06* | (2006.01) |

(Continued)

(52) U.S. Cl.
CPC .... *G01R 31/3606* (2013.01); *H01M 10/4257* (2013.01); *H01M 10/48* (2013.01); *H01M 10/486* (2013.01); *H01M 2/06* (2013.01); *H01M 2/30* (2013.01); *H01M 6/5005* (2013.01); *H01M 10/052* (2013.01)

(58) Field of Classification Search
CPC ...... G01R 31/3606; H01M 2/06; H01M 2/30; H01M 6/5005; H01M 10/4257; H01M 10/48

See application file for complete search history.

(56) References Cited

U.S. PATENT DOCUMENTS 8,541,122 B2   9/2013  Fulop et al.
9,209,497 B2 * 12/2015  Elian ..................... G01M 3/227
(Continued)

FOREIGN PATENT DOCUMENTS

CN         2599767 Y      1/2004
CN       101855773 A     10/2010
(Continued)

*Primary Examiner* — David M Gray
*Assistant Examiner* — Michael Harrison

(57) ABSTRACT

The present invention relates to a battery. The battery includes: a detecting apparatus, located inside the battery and on an anode or cathode end of the battery, and configured to detect an electric potential inside the battery; and a conducting wire, electrically connected to the detecting apparatus and insulated from the anode and cathode of the battery, and configured to export a value of the electric potential measured by the detecting apparatus. The battery according to embodiments of the present invention is provided with a built-in detecting apparatus, which is led out together with the anode and cathode of the battery by using the conducting wire electrically connected to the detecting apparatus. This design achieves accurate and reliable measurement of a potential at a single electrode.

14 Claims, 3 Drawing Sheets

(51) Int. Cl.
*H01M 2/30* (2006.01)
*H01M 6/50* (2006.01)

(56) References Cited

U.S. PATENT DOCUMENTS

| | | |
|---|---|---|
| 2004/0018431 A1 | 1/2004 | Gozdz et al. |
| 2008/0094029 A1 | 4/2008 | Singh |
| 2008/0094031 A1 | 4/2008 | Singh et al. |
| 2009/0104510 A1* | 4/2009 | Fulop ............ H01M 2/30 429/50 |
| 2010/0285338 A1* | 11/2010 | Christensen ......... H01M 4/134 429/50 |
| 2011/0043212 A1 | 2/2011 | Kirchev |
| 2011/0119005 A1 | 5/2011 | Majima et al. |
| 2014/0023888 A1 | 1/2014 | Fulop et al. |

FOREIGN PATENT DOCUMENTS

| | | |
|---|---|---|
| CN | 102044699 A | 5/2011 |
| CN | 102084261 A | 6/2011 |
| CN | 102496750 A | 6/2012 |
| DE | 3151469 A1 | 7/1983 |
| DE | 102011107053 A1 | 10/2012 |
| EP | 1 083 618 A1 | 3/2001 |
| JP | S62190667 A | 8/1987 |
| JP | H03291866 A | 12/1991 |
| JP | 05-127335 A | 5/1993 |
| JP | 1993-266926 A | 10/1993 |
| JP | 2005019116 A | 1/2005 |
| JP | 2010080299 A | 4/2010 |
| JP | 2010-539657 A | 12/2010 |
| JP | 2011-003314 A | 1/2011 |
| JP | 2011-520120 A | 7/2011 |
| WO | WO 99/60652 A1 | 11/1999 |
| WO | WO 2009/036444 A2 | 3/2009 |

* cited by examiner

BATTERY

CROSS-REFERENCE TO RELATED APPLICATIONS

This application is a continuation of International Application No. PCT/CN2012/080785, filed on Aug. 30, 2012, which claims priority to Chinese Patent Application No. 201110428887.0, filed on Dec. 20, 2011, both of which are hereby incorporated by reference in their entireties.

TECHNICAL FIELD

The present invention relates to the terminal field, and in particular, to a battery.

BACKGROUND

A rechargeable secondary battery or battery pack is used more widely in mobile phones, notebook computers, electric tools, electric cars (including hybrid, plug-in hybrid and all-electric cars), backup power systems, and other energy storage systems. In these applications, operation of a battery is generally not within an entire range of an SOC; therefore, it is important to accurately understand a state of charge (state of charge, SOC) of a battery. However, it is usually inaccurate to determine the SOC of a battery by detecting a voltage of the battery. For example, for a lithium-ion battery, a platform voltage exists in a range with an approximately 50% SOC as a center, and a voltage of the battery varies slightly with the SOC in the range of the platform voltage. In addition, the voltage of a battery cannot reflect an electric potential at an electrode (that is, the SOC of the electrode). In an operation process of a battery, when an electrode potential shifts to a certain direction, the battery safety becomes lower but the battery voltage does not change or changes slightly. Therefore, the potentials of electrodes need to be detected to accurately determine the SOC of a battery.

In order to detect the electrode potential at an anode and a cathode of a battery, a third electrode, namely a reference electrode, must be introduced, so that the third electrode as well as the anode and the cathode of the battery together form an electrochemical three-electrode battery system. In the electrochemical three-electrode system, a potential at the reference electrode is required to be always constant. Otherwise, the reference function does not take effect. A specification and location of the reference electrode are important for measuring the electrode potential. If a large polarized electric potential exists between the location of the reference electrode and a measured electrode, accuracy of the electrode potential measured by using the reference electrode is affected by polarization. Therefore, how to introduce and locate a reference electrode are key technical issues. FIG. 1 is a schematic diagram of a battery structure in the prior art, where a reference electrode 1 is located at a cathode end and close to a cathode cover, and a leading-out terminal 2 of the battery is located near a cathode 3. A material of the reference electrode 1 is lithium metal, a lithium alloy, another lithium transition metallic oxide such as a lithium-titanate oxide, or the like. In addition, a porous material is used to encapsulate the reference electrode 1, so as to implement electrical insulation from the anode and cathode. A battery structure designed according to this technical solution has a low cost but does not completely solve a problem that polarization affects the electrode potential. A reason is that: although the reference electrode 1 is close to the cathode cover, there is still a certain distance from the cathode and the reference electrode 1 is led out through an independent terminal 2, and a measured electric potential is not the electric potential at either electrode of the battery. As a result, the electric potential at neither the anode nor the cathode can be measured in an accurate and reliable manner in this solution. In addition, the solution adds an extra electrode leading-out terminal, which results in complication of a manufacturing technique and an increase of battery leakage risk.

Considering the safety of a battery, temperature and internal pressure of the battery during the operation process are also factors that technicians often concern. At present, a method commonly used in the lithium-ion battery field is that a thermal element (for example, a positive temperature coefficient resistor, PTC) is added to an external battery management system to prevent thermal runaway caused by an excessively large current in a circuit, or an explosion-proof valve is disposed on a shell of the battery to prevent an explosion caused by an excessively high internal pressure.

SUMMARY

Embodiments of the present invention provide a battery to detect electric potentials of an anode and cathode of a single battery in a real-time and all-round way, bringing convenience to safety management of a battery or battery pack.

An embodiment of the present invention provides a battery, where the battery includes:

a detecting apparatus, located inside the battery and on an anode or cathode end of the battery, and configured to detect an electric potential inside the battery; and a conducting wire, electrically connected to the detecting apparatus and insulated from the anode and cathode ends of the battery, and configured to export a value of an electric potential to be measured by the detecting apparatus.

A battery according to this embodiment of the present invention has a built-in detecting apparatus, which is led out together with an anode or a cathode of the battery by using a conducting wire electrically connected to the detecting apparatus. This design achieves accurate and reliable measurement of a potential at a single electrode.

DETAILED DESCRIPTION

The following further describes in detail the technical solutions in the present invention by using the accompanying drawings and embodiments.

Figure 1:
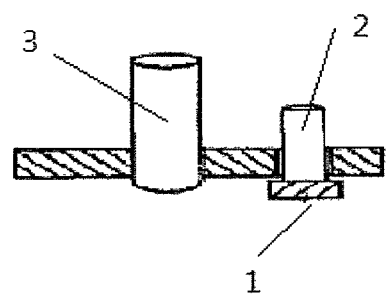
FIG. 1 is a schematic diagram of a battery structure in the prior art.
Figure 2A:
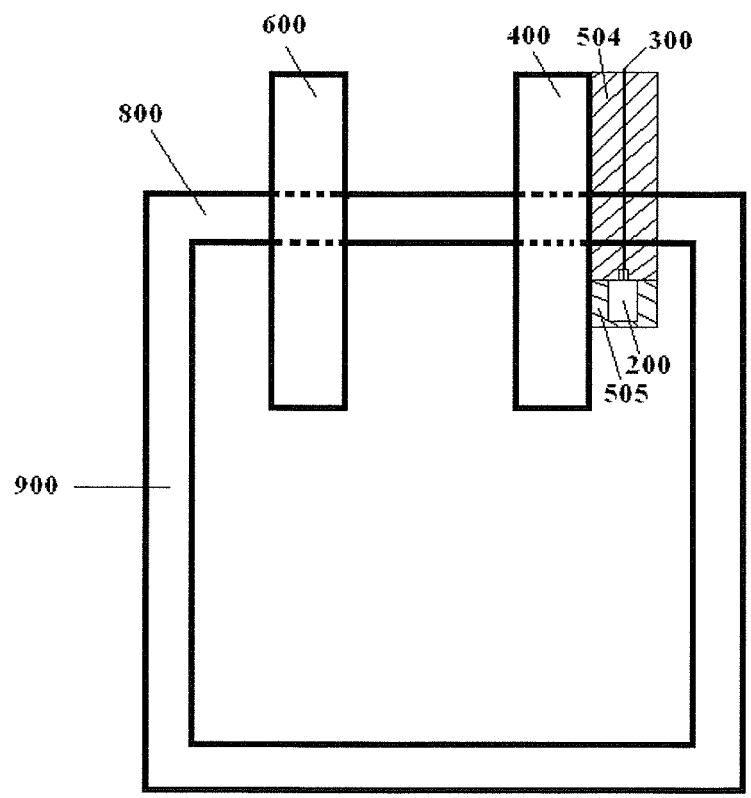
FIG. 2A and FIG. 2B are a front view and a top view of a battery structure according to an embodiment of the present invention.
Figure 2B:
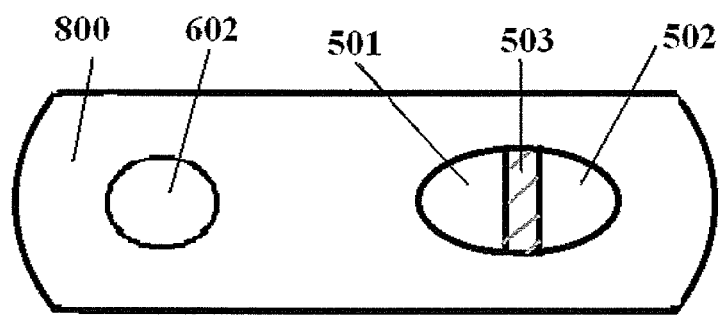

In the embodiments of the present invention, on a premise that complexity of a battery manufacturing technique is not increased, a method, where a reference electrode or a detecting apparatus with a reference electrode is embedded into a battery and led out together with an anode or a cathode of the battery by means of an electrically insulated connection, is used to accurately detect an electrode potential and avoid an increase of leakage risk caused by an increase of a leading-out terminal. FIG. 2A and FIG. 2B are a front view and a top view of a battery structure according to an embodiment of the present invention. A battery shown in FIG. 2A includes a detecting apparatus 200 and a conducting wire 300. The detecting apparatus 200 is located on a cathode end inside the battery and has an encapsulation layer made of a porous insulating material, or another material that is insulating but may be fully soaked by an electrolyte and contact therewith. The encapsulation layer is configured to implement electrical insulation between the detecting apparatus 200 and the anode and cathode of the battery, thereby avoiding an impact on stability of a detection result due to mutual contact between the detecting terminal of the detecting apparatus 200 and the anode and cathode of the battery. The porous material used by the encapsulation layer is microporous polyethylene, insulated ceramic particle, $TiO_2$ adhesive, $Al_2O_3$ adhesive with PVDF, a mixture of other polymer adhesives or another material commonly used for battery insulation. Preferably, in this embodiment of the present invention, the encapsulation layer of the detecting apparatus 200 uses the microporous polyethylene material. The conducting wire 300 electrically connects to the detecting apparatus 200 to export a detection result of the detecting apparatus 200.

Figure 3:
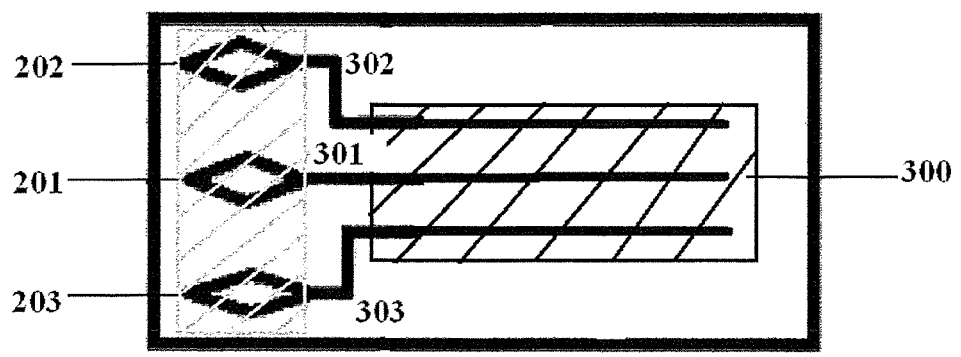
FIG. 3 is a schematic diagram of a detecting apparatus and a connection between the detecting apparatus and a conducting wire according to an embodiment of the present invention.

FIG. 3 is a schematic diagram of a detecting apparatus 200 and a connection between the detecting apparatus 200 and a conducting wire 300 according to an embodiment of the present invention. The detecting apparatus 200 includes a reference electrode terminal 201, configured to detect an electric potential at a single electrode of a battery. The reference electrode terminal 201 has an encapsulation layer made of a porous insulating material which is the same as that of the foregoing detecting apparatus 200, so that the reference electrode terminal 201 is in non-insulated contact with an electrolyte only, but is separated, by means of electrical insulation, from any other contacted part (for example, a cathode to be connected which is described below). This avoids that a mixed electric potential forms in the battery due to mutual contact, which affects stability of the electrode potential and further affects accuracy of a measured value of the electrode potential. A material of the reference electrode terminal 201 changes with a type of a rechargeable battery in use. A material that can be exposed to the air should be used (As described below, because a leading-out wire 300 of the detecting apparatus is welded with a cathode tab 401, a welding environment must be considered.) This type of material includes electrode materials that provide a stable electric potential and thermodynamics reversibility in an application environment of the battery, so that a reference function can be properly implemented. For example, in a lithium-ion battery, the reference electrode terminal 201 uses a material with a stable electric potential in a wider range of SOC to achieve a better reference effect, such as a lithium alloy (Li—Sn, Li—Al, Li—Sb alloy), a lithium-titanate oxide, lithium transition metallic phosphate, and other types of electrode materials with a better reference effect that are known to persons skilled in the art. Lithium metal may also be used in other embodiments.

The detecting apparatus 200 further includes a temperature sensing terminal 202 and/or a pressure sensing terminal 203 inside the battery. The temperature sensing terminal 202 is configured to detect an internal temperature of the battery. The pressure sensing terminal 203 is configured to detect mechanical pressure inside the battery. Thermal runaway caused by an excessively large current inside the battery can be prevented by detecting a change of the internal temperature of the battery, and an explosion caused by an excessively high internal pressure of the battery can be prevented by detecting a change of the internal mechanical pressure of the battery. The temperature sensing terminal 202 and the pressure sensing terminal 203 may have and may not have the encapsulation layer made of a porous insulating material which is used by the foregoing reference electrode terminal 201. A material of the temperature sensing terminal 202 is a thermistor, a thermocouple, a bimetallic finger, a semiconductor, or the like, where the thermistor includes a positive temperature coefficient resistor (PTC) and a negative temperature coefficient resistor (NTC). A material of the pressure sensing terminal 203 is silicon, quartz, sodium tartrate, ammonium dihydrogen phosphate, piezoelectric ceramic such as barium titanate or niobate piezoelectric ceramic, and other polyester materials sensitive to pressure.

Preferably, in this embodiment of the present invention, the reference electrode terminal 201 uses the Li—Sn alloy material, the temperature sensing terminal 202 uses the thermistor or the thermocouple material, and the pressure sensing terminal 203 uses the silicon or quartz material.

The conducting wire 300 includes a conducting wire 301, electrically connected to the reference electrode terminal 201, and configured to export a detection result of the reference electrode terminal 201. The conducting wire 300 may further include a conducting wire 302 electrically connected to the foregoing temperature sensing terminal 202 and/or a conducting wire 303 electrically connected to the pressure sensing terminal 203. The conducting wire 302 is configured to export a measurement result of the foregoing temperature sensing terminal 202. The conducting wire 303 is configured to export a detection result of the foregoing pressure sensing terminal 203. Start ends of the conducting wires led out by detecting terminals are located inside the battery, and each have a non-porous electrically insulated coating (such as polyester, polyurethane, polyester imide, and acetal), and an independent encapsulation layer made of an electrically insulating material that may be soluble with other electrolytes, and is configured to separate or electrically insulate the conducting wire from the battery electrolyte or other battery parts, for example, preventing it from being eroded by the electrolyte, or avoiding an impact on the measurement result due to its contact with the cathode of the battery to be connected. The material of the encapsulation layer may also be the porous insulating material or other materials that are insulating but may be fully soaked by an electrolyte and contact therewith. Portions of all conductive wires that are outside the battery are uniformly encapsulated into one bunch by using the same electrically insulating material and led out of the battery as the leading-out wire 300 (that is, the conducting wire 300) of the detecting apparatus. The conducting wires 301-303 are any conductive metal wires.

Preferably, in this embodiment of the present invention, the conducting wires 301-303 use copper metal wires, and the encapsulation layer is independently covered by non-porous insulating material polyurethane. The battery further includes a cathode 400 of the battery and a fixed port 500. The battery in this embodiment of the present invention introduces the detecting apparatus 200 described above. In order not to add an extra leading-out terminal, a reasonable battery design and manufacturing technique are required. As shown in FIG. 2A, the detecting apparatus 200 establishes an electrical insulated connection with the cathode 400 of the battery inside the battery, and an electrically insulated layer 504 is formed therebetween. The electrically insulated layer 504 uses the same porous electrically insulating material as the encapsulation layer of the detecting apparatus 200. Outside the battery, the conducting wire 300 establishes an electrically insulated connection with the cathode tab 401 of the battery to form an electrically insulated layer 505. A material of the electrically insulated layer 505 is a non-porous electrically insulating material or a porous electrically insulating material that is the same as that of the foregoing conducting wire 300. By using the foregoing electrically insulated connection method, both the detecting apparatus 200 and the conducting wire 300 connected thereto have an electrically insulated connection with the cathode of the battery, which enables each detecting terminal inside the detecting apparatus 200 to properly implement a reference function or monitoring function.

In addition, because the detecting apparatus 200 is led out as an independent third electrode, the lead-out of the apparatus must be electrically insulated from the anode and cathode. Therefore, design of the leading-out terminal is also critical. As shown in FIG. 2B, in this embodiment of the present invention, an end of the leading-out wire 300 of the detecting apparatus and a leading-out end of the cathode 400 are connected to the same fixed port 500, and are separated by means of electrical insulation. Specifically, the end of the leading-out wire 300 of the detecting apparatus is fastened, by welding, to a fixed port 502 of the detecting apparatus, and the cathode tab 401 is fastened, by welding, to a cathodic fixed port 501. The cathodic fixed port 501 and the fixed port 502 of the detecting apparatus are separately located on two portions that are separated, by means of electrical insulation, by an electrically insulated layer 503 on the same fixed port 500. In this embodiment of the present invention, the fixed port 500 is a rivet, and the rivet 500 is separated, by means of electrical insulation, into two portions. The separation by means of electrical insulation may be achieved by means of injection molding, and may also be achieved by using an insulating material such as epoxy. Preferably, in this embodiment of the present invention, the rivet 500 is separated, by means of electrical insulation, into two portions by means of (injection molding).

As described above, according to the solution in which the detecting apparatus 200 and the cathode 400 are connected, the detecting apparatus 200 may be welded when the cathode tab 401 is welded to the battery, which simplifies the manufacturing technique of the battery.

Figure 4:
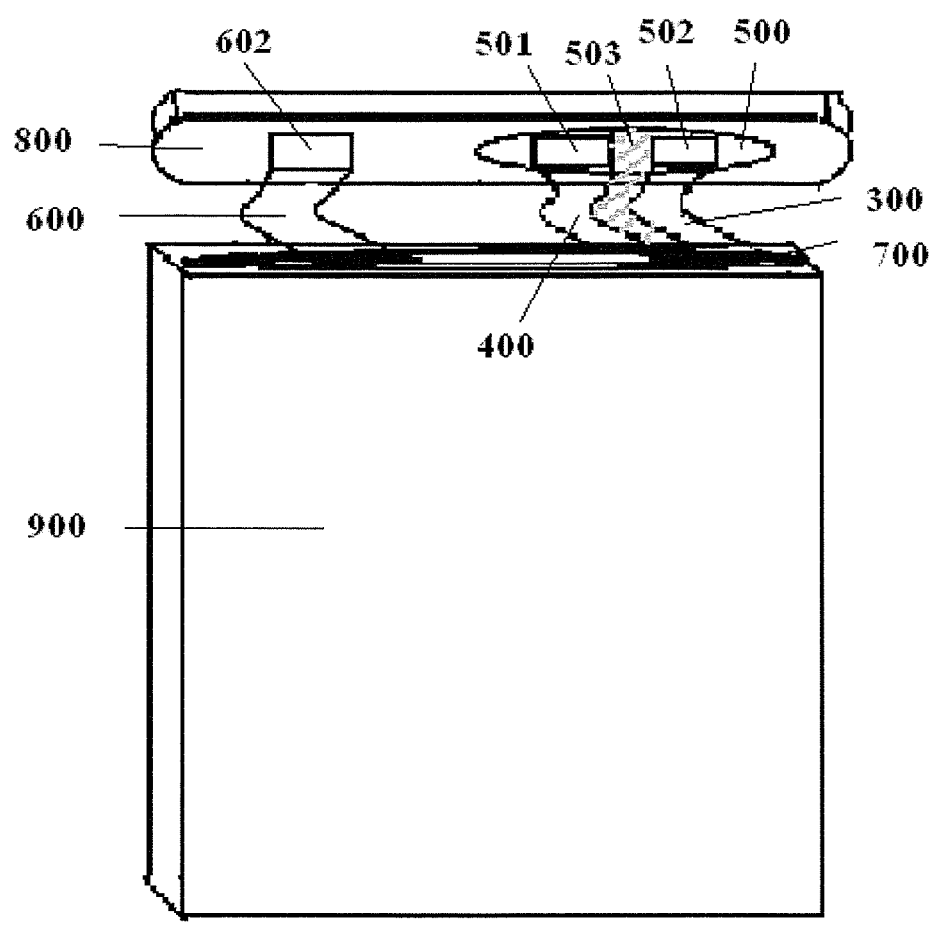
FIG. 4 is an assembly diagram of a battery according to an embodiment of the present invention.

FIG. 4 is an assembly diagram of a battery according to an embodiment of the present invention. The battery further includes an anode 600, an anodic fixed port 602, a core 700, a cover 800, and a shell 900. The core 700 is of a strap type or a winding type and has an anode and a cathode. One end of an anode tab 601 connects to an anode of the core 700, and the other end is fastened to an anodic fixed port 602 of the cover 800. The foregoing rivet 500 where the cathodic fixed port 501 and the fixed port 502 of the detecting apparatus are located is disposed on the cover 800, with a position directly opposite to a space above the cathode 400 and the detecting apparatus 200.

In this embodiment of the present invention, the anode 600 of the battery is any existing anode of a battery. For example, the anode of a lithium-ion battery may be a lithium transition metallic oxide, such as LiCoO2, LiNiO2, LiMnO2, LiMn2O4, LiFePO4, and V2O5, or other anode materials, adhesives and conductive additives that are known to persons skilled in the art. Anode materials of the battery containing water that is used as an electrolyte, which are suitable for lead-acid batteries or nickel-cadmium batteries, include lead dioxide, nickel hydroxide, manganese dioxide, and the like. Preferably, the anode of the battery in this embodiment of the present invention uses the lithium transition metallic oxide material.

In this embodiment of the present invention, materials that are suitable for the cathode 400 of the lithium-ion battery include carbons, alloys, or chemical compounds formed between Li and metal alloy. The metal alloy includes one or more of Sn, Si, Sb, Al, Zn, and Ag, or other cathode materials that are known to persons skilled in the art. Cathode materials of the battery containing water that is used as the electrolyte, which are suitable for lead-acid batteries or nickel-cadmium batteries, include lead, cadmium hydroxide, metal hydride alloy, zinc, and carbon. Preferably, in this embodiment of the present invention, the cathode of the battery uses the carbon material.

In this embodiment of the present invention, the battery where the foregoing detecting apparatus 200 can be embedded may be a lead-acid battery, a Pb-A battery, an alkaline-manganese battery, a nickel-cadmium battery, a nickel-metal hydride or "NIMH" battery, and a lithium-ion or "Li-ion" battery. The battery may be of any geometrical shape, for example, a cylindrical battery in a winding structure and a prismatic battery in a winding structure or laminated structure. The volume and capacity of the battery may be large or small.

Specifically, in the foregoing battery having the detecting apparatus 200, a process of embedding the detecting apparatus 200 into the battery is described as follows:

Firstly, use the foregoing various encapsulation materials to encapsulate the detecting apparatus 200, built-in detecting terminals 201-203 thereof, and the conducting wires 301-303 that are electrically connected to the detecting terminals 201-203 respectively, which includes the following steps: encapsulate the reference electrode terminal 201 by using a porous insulating material; encapsulate the temperature sensing terminal 202 and the pressure sensing terminal 203 also by using a porous insulating material or skip encapsulating them but embed them into the detecting apparatus 200 in a manner that does not affect the temperature and pressure detection; electrically connect the conducting wires 301-303 and the three detecting terminals 201-203 respectively, and encapsulate the wires section by section by using a non-porous insulating material; and encapsulate the detecting apparatus 200 overall by using a porous insulating material. Secondly, connect, by means of electrical insulation, the detecting apparatus 200 and the cathode 400 of the battery, which includes the following steps: splice, by means of electrical insulation, the conducting wire 300 and the cathode tab of the battery by using a non-porous insulating material, and embed the conducting wire 300 into the battery and lead the conducting wire 300 out of the battery. Finally, connect both the cathode tab 401 of the battery and an end of the conducting wire 300 to the same port, that is, the rivet 500, on the cover 800 of the battery.

An operation process of the battery in this embodiment of the present invention is described as follows:

Firstly, connect the battery and an external display instrument. Connect the battery and the display instrument disposed outside the battery by using a conducting wire, so as to read data measured by the detecting apparatus 200. Then, detect an electric potential at a cathode of the battery, an internal temperature, and an internal pressure of the battery. When the electric potential at the cathode of the battery changes, the detecting apparatus 200 obtains, by measuring, detailed data of the change to the electric potential, and leads out and transmits the data to the display instrument by using the conducting wire 300. Because the detecting apparatus 200 connects, by means of electrical insulation, to the cathode of the battery as a whole, an electric potential at the cathode of the battery measured by the reference electrode terminal 201 is not affected by partial polarization of the electrolyte caused by an improper position of the reference electrode. The measured value is a value of the electric potential in a case of minimum partial polarization of the electrolyte, which is close to an actual value. A SOC of the battery may be accurately determined according to the measured electric potential value, so that charging and discharging management for the battery can be performed more properly. Further, a shift condition of the electrode potential is determined according to a change of the measured electric potential value, and thereby the safety of the battery is determined to understand the usage state of the battery in a timely manner. In addition, a user may synchronously monitor safety of the battery according to a change of a value of an internal temperature and mechanical pressure of the battery measured by the temperature sensing terminal 202 and the pressure sensing terminal 203 that are disposed inside the detecting apparatus 200. A corresponding maintenance measure may be taken in a timely manner according to a sudden change of the battery to prevent thermal runaway caused by an excessively large current inside the battery, or an explosion caused by an excessively high internal pressure of the battery. As described above, in this embodiment of the present invention, a technology for introducing a detecting apparatus, which includes a reference electrode terminal and may further include a temperature sensing terminal and/or a pressure sensing terminal, to the battery is used, facilitating monitoring of the SOC, the internal temperature, and the internal pressure of a battery, and presenting great advantages. First, compared with a solution in the prior art, in which a reference electrode is separated from the anode and cathode of a battery for separate placement, in the embodiment of the present invention, the reference electrode connects, by means of electrical insulation, to the anode and cathode of the battery as a whole, which may measure a true value of the electrode potential, which accurately determines the SOC of the electric potential, and a failure pattern of the battery. In particular, in some applications, such as a plug-in hybrid electric vehicle (PHEV), the battery usually does not operate in the entire range of the SOC, and an electric potential shift occurs on the electrode because the electrode cannot fully deintercalate the lithium after partial lithium ions are consumed due to circulation. In this case, it is of great significance to introduce the detecting apparatus to monitor the SOC of a single electrode. Second, compared with a solution in the prior art, in which the temperature sensing terminal and the pressure sensing terminal are disposed outside the battery, in the embodiment of the present invention, a sudden change of the internal temperature and the internal pressure of the battery may be detected in a more timely manner, which implements real-time monitoring of the battery. Third, compared with the prior art, in this embodiment of the present invention, each detecting terminal is integrated into the detecting apparatus and led out together with the cathode. In the one hand, no extra operation needs to be added to lead out the detecting apparatus, which simplifies the manufacturing technique of the battery. In the other hand, an increase in battery leakage risk due to an additionally added leading-out terminal is also avoided, which improves safety in use of the battery.

The foregoing specific embodiments further describe the objectives, technical solutions, and beneficial effects of the present invention in detail. It should be understood that, the foregoing descriptions are merely specific embodiments of the present invention, but are not intended to limit the protection scope of the present invention. Any modifications, equivalent replacements, or improvements made without departing from the spirit and principle of the present invention shall fall within the protection scope of the present invention.

What is claimed is:
1. A battery, comprising:
a battery core having an anode and a cathode:
an anode tab electrically connected to the anode, and a cathode tab electrically connected to the cathode;
a detecting apparatus, located inside the battery core at an anode end or a cathode end of the battery, comprising a reference electrode terminal and configured to detect an electric potential inside the battery;
a conducting wire, electrically connected to the reference electrode terminal of the detecting apparatus and insulated from the anode and the cathode of the battery, and configured to export a value of the electric potential to be measured by the detecting apparatus; and
wherein the conducting wire is connected to a single port within the battery, and wherein the anode tab or the cathode tab is connected to the single port of the battery.

2. The battery according to claim 1, wherein the detecting apparatus further comprises:
a temperature sensing terminal, configured to detect a temperature inside the battery; and
a second conducting wire configured to export a value of the temperature.

3. The battery according to claim 1, wherein the detecting apparatus further comprises:
a pressure sensing terminal, configured to detect a mechanical pressure inside the battery; and
a third conducting wire configured to export a value of the mechanical pressure.

4. The battery according to claim 1, wherein the detecting apparatus further comprises:
a temperature sensing terminal and a pressure sensing terminal, configured to detect a temperature and mechanical pressure inside the battery separately; and
a second conducting wire and a third conducting wire configured to export a value of the temperature and the mechanical pressure.

5. The battery according to claim 1, wherein the detecting apparatus comprises an electrically insulated encapsulation layer.

6. The battery according to claim 5, wherein the electrically insulated encapsulation layer comprises at least one of microporous polyethylene, an insulated ceramic particle, a $TiO_2$ adhesive, an $Al_2O_3$ adhesive, a mixture of polymer adhesives or an electrically insulating material fully soaked by an electrolyte and having contact therewith.

7. The battery according to claim 1, wherein the conducting wire comprises an electrically insulated encapsulation layer.

8. The battery according to claim 7, wherein the electrically insulated encapsulation layer comprises at least one of polyester, polyurethane, polyester imide, acetal, microporous polyethylene, an insulated ceramic particle, a $TiO_2$ adhesive, an $Al_2O_3$ adhesive or a mixture of polymer adhesives.

9. The battery according to claim 1, wherein the conducting wire is insulated from the anode or the cathode of the battery by using an insulation layer.

10. The battery according to claim 9, wherein the insulation layer comprises at least one of polyester, polyurethane, polyester imide, acetal, microporous polyethylene, an insulated ceramic particle, a TiO2 adhesive, an Al2O3 adhesive or a mixture of polymer adhesives.

11. A battery, comprising:
a battery core having an anode and a cathode;
an anode tab electrically connected to the anode, and a cathode tab electrically connected to the cathode;
a detecting apparatus, located inside the battery core at an anode end or a cathode end of the battery, comprising,
   a reference electrode terminal configured to detect an electric potential inside the battery, and
   a pressure sensing terminal configured to detect a mechanical pressure inside the battery;
a conducting wire, electrically connected to the reference electrode terminal of the detecting apparatus and insulated from the anode and the cathode of the battery, and configured to export a value of the electric potential to be measured by the detecting apparatus and a value of the mechanical pressure;
wherein the conducting wire is connected to a single port of the battery, wherein the anode tab or the cathode tab is connected to the single port of the battery; and
a cover comprising the single port.

12. The battery according to claim 11, wherein the single port comprises:
a first portion electrically connected to the conducting wire; and
a second portion electrically connected to the anode tab or cathode tab.

13. The battery according to claim 1, wherein the single port comprises:
a first portion electrically connected to the conducting wire; and
a second portion electrically connected to the anode tab or cathode tab.

14. The battery according to claim 13, further comprising:
a cover comprising the first portion and the second portion of the single port.

* * * * *